United States Patent
Salj

(10) Patent No.: US 12,003,087 B2
(45) Date of Patent: Jun. 4, 2024

(54) TIME SYNCHRONIZATION BETWEEN IEDS OF DIFFERENT SUBSTATIONS

(71) Applicant: Hitachi Energy Ltd, Zürich (CH)

(72) Inventor: Johan Salj, Eskilstuna (SE)

(73) Assignee: Hitachi Energy Ltd, Zürich (CH)

( * ) Notice: Subject to any disclaimer, the term of this patent is extended or adjusted under 35 U.S.C. 154(b) by 130 days.

(21) Appl. No.: 17/796,248

(22) PCT Filed: Jan. 27, 2021

(86) PCT No.: PCT/EP2021/051787
§ 371 (c)(1),
(2) Date: Jul. 28, 2022

(87) PCT Pub. No.: WO2021/151909
PCT Pub. Date: Aug. 5, 2021

(65) Prior Publication Data
US 2023/0077975 A1    Mar. 16, 2023

(30) Foreign Application Priority Data

Jan. 31, 2020  (EP) ..................... 20154871

(51) Int. Cl.
*H02H 1/00* (2006.01)
*H02H 7/26* (2006.01)
*H04L 7/00* (2006.01)

(52) U.S. Cl.
CPC .......... *H02H 1/0061* (2013.01); *H02H 7/263* (2013.01); *H04L 7/0008* (2013.01)

(58) Field of Classification Search
CPC ........ H02H 1/0061; H02H 7/263; H02H 3/30; H04L 7/0008; G01R 19/2513; G06F 1/12
See application file for complete search history.

(56) References Cited

U.S. PATENT DOCUMENTS

| | | |
|---|---|---|
| 9,537,648 B2 | 1/2017 | Cachin et al. |
| 9,590,411 B2 | 3/2017 | Achanta |
| 9,614,577 B2 | 4/2017 | Dzung |
| | (Continued) | |

FOREIGN PATENT DOCUMENTS

| | | |
|---|---|---|
| CN | 102215100 A | 10/2011 |
| JP | 2010-279235 A | 12/2010 |
| | (Continued) | |

OTHER PUBLICATIONS

International Search Report and Written Opinion of the International Searching Authority for the corresponding PCT Application No. PCT/EP2021/051787 dated Sep. 27, 2021.

*Primary Examiner* — David S Huang
(74) *Attorney, Agent, or Firm* — Procopio, Cory, Hargreaves & Savitch LLP

(57) ABSTRACT

There is provided mechanisms for time-synchronized communication of packets between a first substation and a second substation interconnected by a communication channel. Samples obtained within the second substation are provided with time information associated with a common reference clock and sent to the first substation, at which a time-wise synchronization of the received samples with samples obtained within the first substation is performed by means of the time information and a time difference between the common reference clock and a local reference clock of the first substation.

20 Claims, 4 Drawing Sheets

(56) References Cited

U.S. PATENT DOCUMENTS

| | | |
|---|---|---|
| 2009/0089608 A1 | 4/2009 | Guzman-Casillas |
| 2013/0094372 A1 | 4/2013 | Boot |
| 2015/0222520 A1 | 8/2015 | Thrybom |
| 2017/0059636 A1 | 3/2017 | Kerger et al. |
| 2018/0152022 A1* | 5/2018 | Manson .................. G01R 31/50 |
| 2019/0324074 A1 | 10/2019 | Thompson et al. |
| 2019/0386485 A1* | 12/2019 | Hao .......................... H02H 3/08 |

FOREIGN PATENT DOCUMENTS

| | | |
|---|---|---|
| JP | 2012-222833 A | 11/2012 |
| JP | 2018-91828 A | 6/2018 |

* cited by examiner

TIME SYNCHRONIZATION BETWEEN IEDS OF DIFFERENT SUBSTATIONS

CROSS-REFERENCE TO RELATED APPLICATIONS

The present application is a national stage entry of International Patent Application No. PCT/EP2021/051787, filed on Jan. 27, 2021, which claims priority to European Patent Application No. 20154871.6, filed on Jan. 31, 2020, which are both hereby incorporated herein by reference as if set forth in their entireties.

TECHNICAL FIELD

Embodiments presented herein relate to a method, an intelligent electronic device (IED), a computer program, and a computer program product for time-synchronized communication of packets between IEDs.

BACKGROUND

In general terms, substations are part of an electrical generation, transmission, and distribution system. Substations act as connection points between different transmission lines of the electrical system and might additionally transform voltage from high to low, or the reverse, or perform any of several other important functions. Between the generating station and consumer, electric power may flow through several substations at different voltage levels. A substation may include transformers to change voltage levels between high transmission voltages and lower distribution voltages, or at the interconnection of two different transmission voltages.

In general terms, substations are often unattended, relying on remote supervision and control. In this respect, data streams in packets from different sources within a substation as well as from other substations, may be fed to a line differential protection function configured to make a trip decision and thus to determine whether or not a circuit breaker is to trip.

Traditionally, synchronous communication over SONET (Synchronous optical Networking) or SDH (Synchronous Digital Hierarchy) with a symmetrical communication delay has been used for communication of packets to and from the line differential protection. When using SONET or SDH, the communication link can be used to gain a common time reference for comparison of phase values as communicated from the different sources, and thus for line differential protection.

Modern wide area networks are packet based with a non-constant transmission delay (e.g. experiencing jitter and non-symmetrical delay). Therefore, a time reference for the different packets must be provided for using other mechanisms.

One mechanism is to use accurate clocks (such as provided by the Global Positioning System (GPS)) at all sources to achieve a common time reference in the power network to be protected. One drawback with using GPS based clocks is that they are sensitive to bad weather conditions and spoofing.

Another mechanism is to use a wide area network with high precision time synchronization capability (such as IEEE1588; the Precision Time Protocol; PTP) and using one network clock to perform time synchronization of all sources involved in sending packets to the line differential protection function. Such mechanisms work well in a traditional substation. However, when combining line differential protection with merging units, each substation must keep a common time reference not only within the substation but also with other substations.

Hence, there is still a need for improved time synchronization between substations.

SUMMARY

An object of embodiments herein is to provide time-synchronized communication of packets between different substations not suffering from the issues mentioned above, or at least where the issues mentioned above have been reduced or mitigated.

According to a first aspect there is presented a method for time-synchronized communication of packets between a first substation and a second substation interconnected by a communication channel. The method is performed at the first substation and comprises receiving a packet of samples from the second substation over the communication channel. The samples have been obtained within the second substation and provided with time information associated with a common reference clock. The method also comprises receiving a time indication from the common reference clock over the communication channel, performing time-wise synchronization of the samples of the received packet with samples obtained within the first substation. The synchronization includes to time-wisely compensating the samples of the received packet by means of the time information and a first time difference between the common reference clock and a local reference clock of the first substation.

According to a second aspect there is presented an IED for time-synchronized communication of packets between a first and a second substation. The IED comprises processing circuitry. The processing circuitry is configured to cause the IED to perform a method according to the first aspect.

According to a third aspect there is presented a computer program for time-synchronized communication of packets between substations, the computer program comprising computer program code which, when run on an IED of a substation, causes the IED to perform a method according to the first aspect.

According to a fourth aspect there is presented a computer program product comprising a computer program according to the third aspect and a computer readable storage medium on which the computer program is stored. The computer readable storage medium could be a non-transitory computer readable storage medium.

Advantageously these aspects provide efficient time synchronization between different substations in general, and between IEDs of different substations in particular.

Advantageously these aspects enable efficient operation of line differential protection functions operating on samples obtained in different substations.

Advantageously these aspects are usable when installing line differential application in an existing substation with a less accurate time synchronisation (based on the Simple Network Time Protocol (SNTP)), such installing can be done without upgrading the station clock.

By the time information being associated with the common reference clock is generally meant that the time information comprises information that may be directly or indirectly derived from the common reference clock. Thus, the time information may for example comprise an indication of a time, as provided by the common reference clock. Alternatively, or additionally the time information may comprise a time difference, or an indication of such difference, between the common reference clock and a local reference clock of the substation, at which the timestamped samples are obtained, and an indication of a time of said local reference clock. Further, the time information may comprise a timestamp of a sample according to the common reference clock or according to a local reference clock of the first or second substation. Advantageously, the time information comprises information that allows for the receiving substation to perform a time-wise synchronization of the received, preferably timestamped samples with samples as obtained within the receiving substation.

Advantageously these aspects allow for different substations, such as the first and second substation, to operate according to a respective local reference clock, and to be able to communicate with each other without being synchronized. Thus, it will be appreciated that the first substation and the second substation may operate according to local reference clocks that differ from each other, and also from the common reference clock. Since the substations have their own, local reference clock they do not have to rely on the common reference clock for their operation.

The packet of samples and the time indication from the common reference clock may be transmitted over the same communication channel, such as a packet-switched network, interconnecting the substations.

According to an embodiment, the samples obtained within the first substations may be provided with time information, such as a timestamp, associated with the common reference clock. The samples, provided with the time information, may be sent in a first packet of samples to the second substation over the communication channel, such as the packet-switched network. The packet of samples received from the second substation may be referred to as a second packet of samples.

It will be appreciated that the method may be performed by a processing circuitry of the substation. Examples of such processing circuitry may include microprocessor-based controllers, such as for example an intelligent electronic device (IED). Thus, according to an embodiment, the method may be performed by a first intelligent electronic device, IED of the first substation, whereas the second substation may comprise a second IED for communicating with the first IED over the communication channel. Further, the second IED may be configured to determine the second time difference.

According to an embodiment there is presented a method for time-synchronized communication of packets between a first IED of a first substation and a second IED of a second substation as outlined in connection with the above aspects. The method comprises performing at least one of a first action and a second action. The first action may comprise determining a first time difference between the local reference clock of the first substation and a common reference clock. The first action may comprise sending a first packet of samples, as obtained within the first substation, to the second IED over the network interface. The first packet may be timestamped according to the local reference clock of the first substation and comprises an indication of the first time difference. The second action may comprise receiving a second packet of samples, as obtained within the second substation, from the second IED over the network interface. The second packet may be timestamped according to the local reference clock of the second substation and comprise an indication of a second time difference as determined by the second IED between the local reference clock of the second substation and the common reference clock. The second action may comprise performing time-wise synchronization of the samples of the second packet with samples as obtained within the first substation by time-wise compensating the samples of the second packet according to a difference between the first time difference and the second time difference.

According to an embodiment each IED may comprise its own substation interface for communication within its substation and a network interface for communication with IEDs of other substations over the packet-switched network. Each substation interface may be associated with its own local reference clock used as substation-internal time synchronization reference. The network interface may be configured to receive the signal from the common reference clock.

According to an embodiment, the samples may represent current values. A differential current may be calculated as a difference between the compensated samples and the samples as obtained within the first substation. The differential current may be provided to a line differential protection function in the first substation.

According to some embodiments, a first time difference may be determined as the difference between the common reference clock and the local reference clock of the first substation. Further, a second time difference may be determined as a difference between the common reference clock and a local reference clock of the second substation. It may be verified that a difference between the first time difference and the second time difference is smaller than a time threshold before the differential current is provided to the line differential protection function. The line differential protection function may be blocked when the difference between the first time difference and the second time difference is not smaller than the time threshold. Further, an alarm notification of lost time-synchronized communication may be issued.

According to some embodiments, the communication over the network interface may be facilitated using PTP or TSN. Further, the communication over the substation interface may be facilitated using a PTP utility profile. Communication over the network interface may be facilitated using a PTP telecom profile.

According to an embodiment, each of the local reference clocks may have higher accuracy than the common reference clock. Alternatively, each of the local reference clocks may have a lower accuracy than the common reference clock. Further, each local reference clocks may be a substation clock, whereas the common reference clock may be a network clock or one of the substation clocks.

Other objectives, features and advantages of the enclosed embodiments will be apparent from the following detailed disclosure, from the attached dependent claims as well as from the drawings.

Generally, all terms used in the claims are to be interpreted according to their ordinary meaning in the technical field, unless explicitly defined otherwise herein. All references to "a/an/the element, apparatus, component, means, module, action, etc." are to be interpreted openly as referring to at least one instance of the element, apparatus, component, means, module, action, etc., unless explicitly stated otherwise.

The actions of any method disclosed herein do not have to be performed in the exact order disclosed, unless explicitly stated.

BRIEF DESCRIPTION OF THE DRAWINGS

The inventive concept is now described, by way of example, with reference to the accompanying drawings, in which.

DETAILED DESCRIPTION

The inventive concept will now be described more fully hereinafter with reference to the accompanying drawings, in which certain embodiments of the inventive concept are shown. This inventive concept may, however, be embodied in many different forms and should not be construed as limited to the embodiments set forth herein; rather, these embodiments are provided by way of example so that this disclosure will be thorough and complete, and will fully convey the scope of the inventive concept to those skilled in the art. Like numbers refer to like elements throughout the description. Any action or feature illustrated by dashed lines should be regarded as optional.

Figure 1:
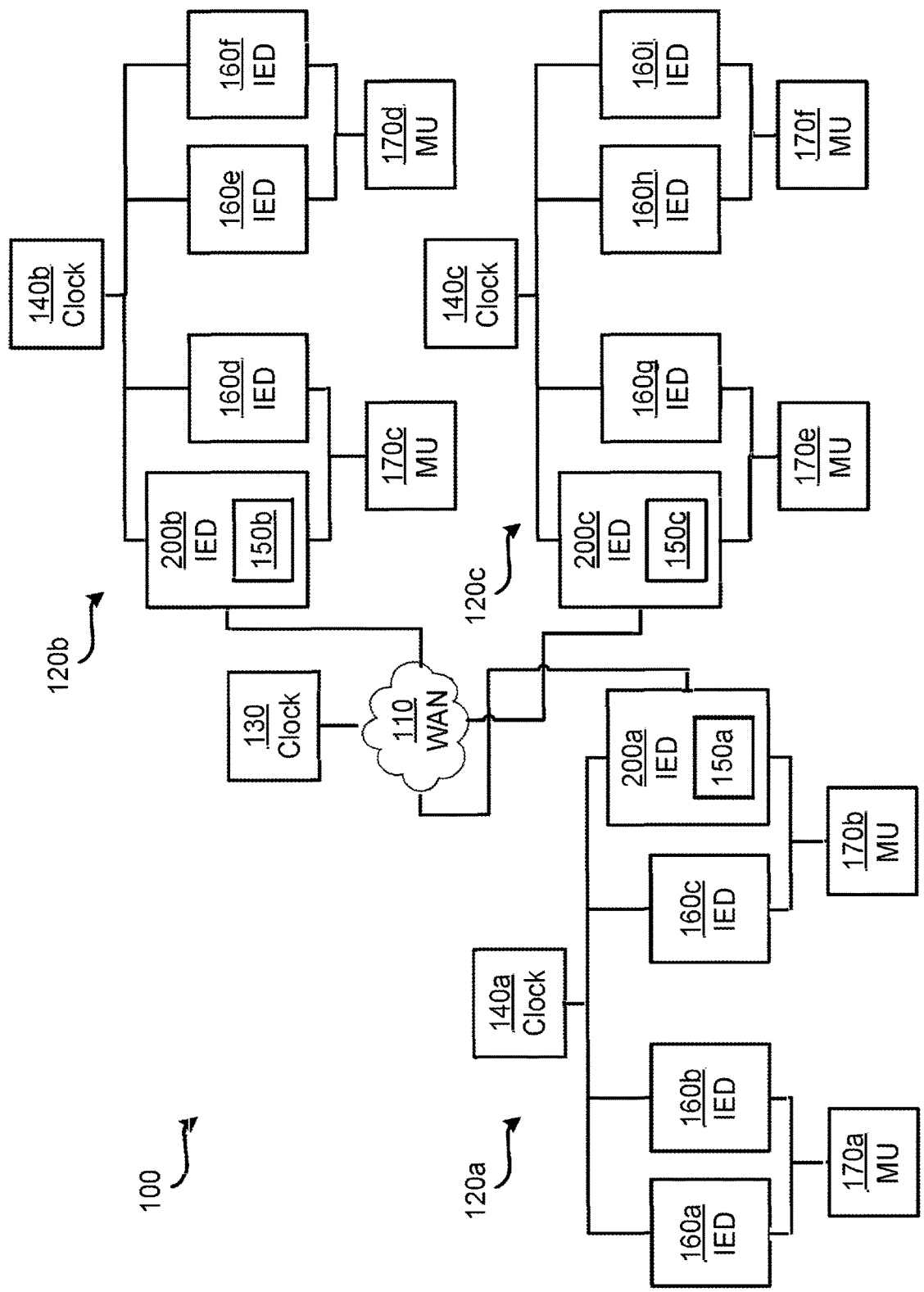
FIG. 1 is a schematic diagram illustrating a substation network according to embodiments.

FIG. 1 is a schematic diagram illustrating a substation network 100 where embodiments presented herein can be applied. The substation network 100 comprises merging units (MUs) 170a:170f acting as data sources. The MUs 170a:170f are configured to provide data streams, in terms of samples in packets, to line differential protection functions 150a:150c. Each data stream might comprise analog samples, for example representing voltage or current measurements of MUs 170a:170f in the substation network 100. The MUs 170a:170f belong to substations 120a:120c in the substation network 100 and provide samples to IEDs 200a:200c, 160a:160i.

Each line differential protection function 150a:150c is part of, integrated with, or collocated with, a respective one of the IEDs 200a:200c. In this respect, each IED 200a:200c might itself be a line differential protection function 150a:150c or the line differential protection function 150a:150c might be implemented in the IEDs 200a:200c. There could be different examples of line differential protection functions. In some examples the line differential protection function 150a:150c is a relay protection function or a control function, such as a synchronization check function.

The IEDs 200a:200c are configured to communicate with each other over a communication channel, such as wide area network (WAN) 110. Whereas the communication between the IEDs 200a:200c is synchronized according to a common reference clock 130, the communication within each substation 120a:120c is synchronized according to a respective local reference clock 140a:140c.

As noted above, there is still a need for improved time synchronization between substations 120a:120c.

At least some of the herein disclosed embodiments are therefore based on using the common reference clock 130 as a common reference for samples associated with the line differential protection functions 150a:150c. The IED 200a:200c housing the line differential protection functions 150a:150c uses its local reference clock 140a:140c for synchronizing its own internal clock. As will be further disclosed below, whereas use of only the local reference clock 140a:140c is sufficient for synchronizing communication within the IED 200a:200c, use of the local reference clock 140a:140c as well as of the common reference clock 130 is required for synchronizing the line differential protection functions 150a:150c, or at least of the samples used by the line differential protection functions 150a:150c, when samples as used by the line differential protection functions 150a:150c are communicated from one IED 200a:200c to another IED 200a:200c.

Figure 2:
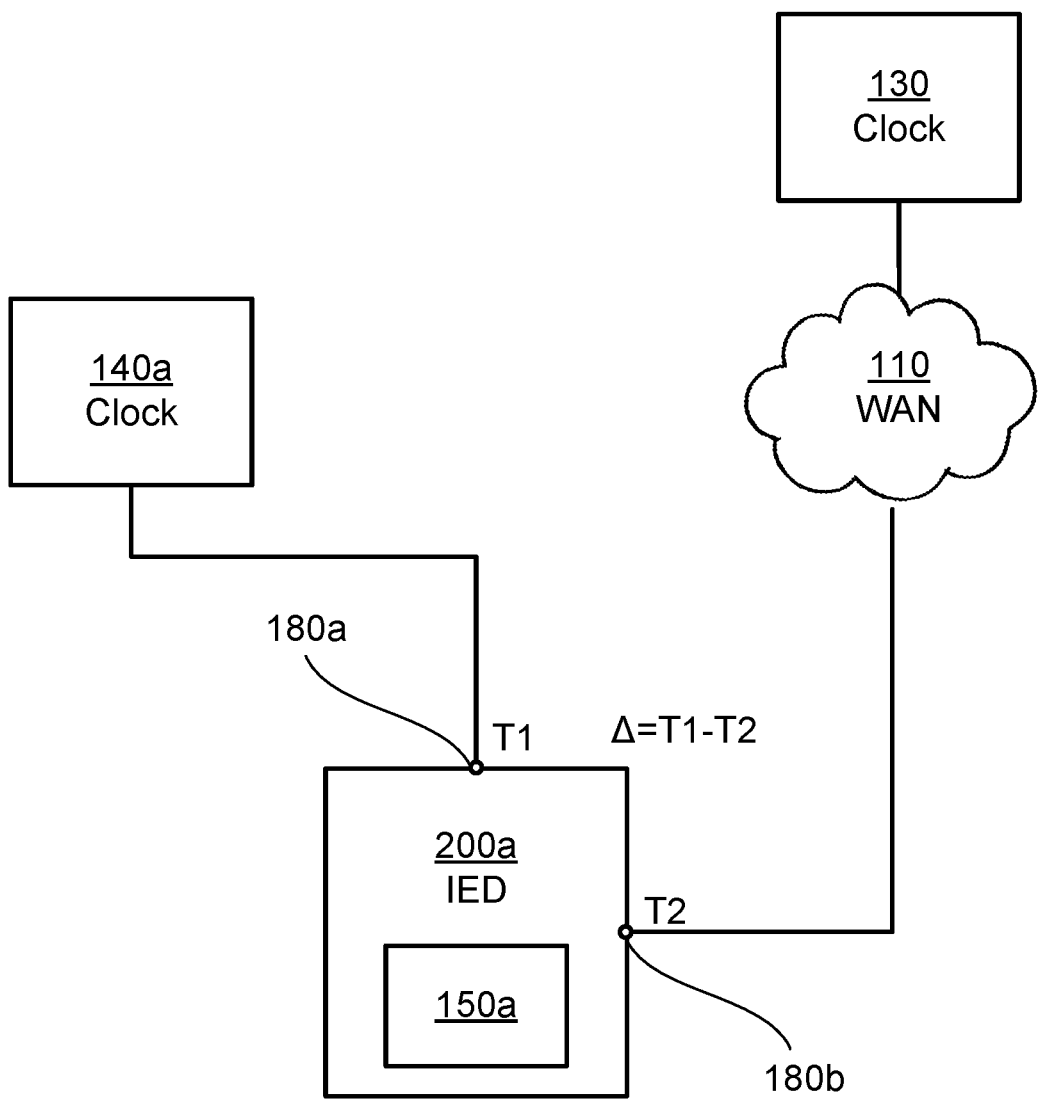
FIG. 2 schematically illustrates part of the substation network in FIG. 1 according to embodiments.

FIG. 2 schematically illustrates a part of the substation network in FIG. 1 and illustrates IED 200a and its interface 180a to the local reference clock 140a and its interface 180b to the common reference clock 130. As illustrated in FIG. 2, IED 200a is internally synchronized to the local reference clock 140a, as given by time T1, and is configured to calculate a time offset Δ, or time difference, between the local reference clock 140a and the common reference clock 130, as given by time T2. Thus, Δ=T1−T2. As will be further disclosed below, this offset Δ might also be used to adjust the timestamp of the time information of the samples that are sent and received in packets to/from an IED 200b:200c of another substation. This enables all samples to be provided with time information, such as a timestamp, using a common time scale, regardless of where in the substation network 100 the samples are obtained. Thus, when IED 200a receives samples from another IED 200b:200c it can adjust, for example by resampling, and thus align the samples before calculating any differential current. This is enabled whilst keeping the communication within the substation 120a independent of the common reference clock 130.

There could be different protocols used for communication over the network interface 180b and for communication over the substation interface 180a. According to an embodiment, communication over the network interface 180b is facilitated using the Precision Time Protocol (PTP) or Time-Sensitive Networking (TSN). In some examples, communication over the substation interface 180a is facilitated using the PTP utility profile (i.e., the Precision Time Protocol Power Utility Profile for Frequency Synchronization defined in IEC 61850-9-3) or the Precision Time Protocol Industrial Profile as defined in IEC 62439-3, whereas communication over the network interface 180b is facilitated using the PTP telecom profile (i.e., the Precision Time Protocol Telecom Profile for Frequency Synchronization).

There could be different relations between the local reference clocks 140a:140c and the common reference clock 130. In some aspects, each of the local reference clocks 140a:140c has higher accuracy than the common reference clock 130. In some aspects, each of the local reference clocks 140a:140c has lower accuracy than the common reference clock 130. The latter could be the case where the line differential application is less dependent of the substation synchronisation. In some examples, each local reference clock 140a:140c is a substation clock. In some examples, the common reference clock 130 is either a network clock or one of the substation clocks 140a:140c. That is, in some examples, one of the substation clocks 140a:140c acts as network clock. This implies then that for one of the IEDs, its time difference between its local reference clock and the common reference clock would be zero. Further, an internal clock in one of the IEDs 200a:200c might act as a network clock. Again, this implies then that for one of the IEDs, its time difference between its local reference clock and the common reference clock would be zero.

The embodiments disclosed herein in particular relate to mechanisms for time-synchronized communication of packets between substations interconnected by a packet-switched network. In particular, the method may be performed in connection with communication of packets between IEDs

200a:200c of the respective substations. The packets might comprise samples representing current values that are used by the line differential protection functions 150a:150c. The achieved time-synchronized communication might thus be used for efficient time synchronization of the line differential protection functions 150a:150c, or at least of the samples used by the line differential protection functions 150a:150c. In order to obtain such mechanisms there is provided an IED 200a of a substation, a method performed by the IED 200a, a computer program product comprising code, for example in the form of a computer program, that when run on an IED 200a, causes the IED 200a to perform the method.

Hereinafter, for illustrative purposes and without imposing any limitations, IED 200a will be denoted a first IED and IED 200b will be denoted a second IED 200b. However, this does not imply that there is any hierarchical relation between the first IED 200a and the second IED 200b. Further, it is appreciated that the method may be performed by means of other processing circuitry of the substation. The herein disclosed IEDs are an example of such processing circuitry and are employed to illustrate exemplary implementation of the general concept of time-synchronized communication of packets between substations as defined in the appended claims.

Figure 3:
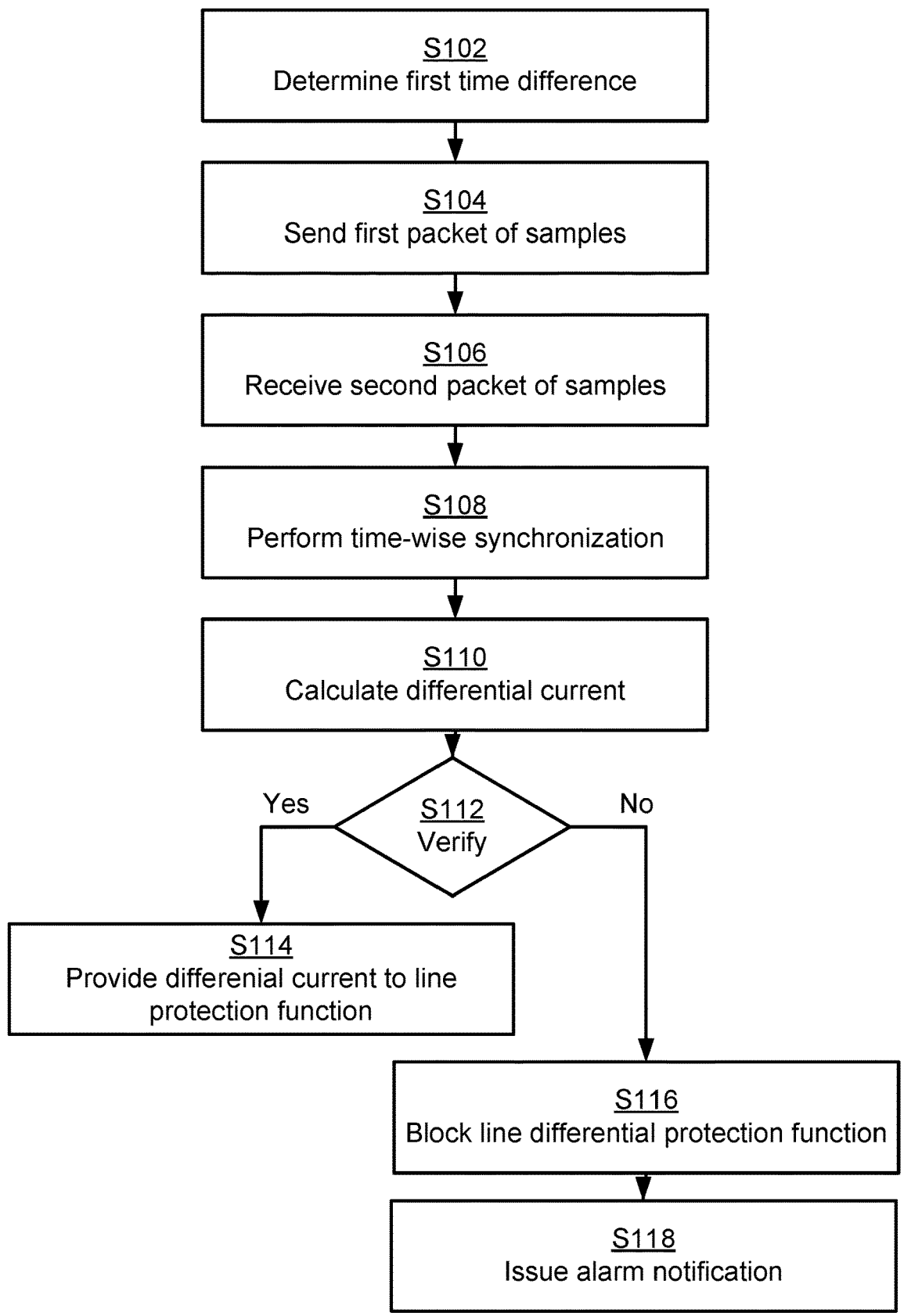
FIG. 3 is a flowchart of methods according to embodiments.

FIG. 3 is a flowchart illustrating embodiments of methods, as performed at the first substation 120a, for time-synchronized communication of packets between the first substation 120a and the second substation 120b. In the present example, the methods may be performed by a first IED 200a of the first substation 120a.

The first IED 200a of the first substation 120a is configured to perform at least one of a first action and a second action. The first actions pertain to a scenario where the first IED 200a sends a first packet of samples over the packet-switched network and the second action pertains to a scenario where the first IED 200a receives a second packet of samples over the packet-switched network. Thus, in some aspects the first IED 200a only sends packets of samples, in other aspects the first IED 200a only receives packets of samples, and in yet other aspects the first IED 200a both sends and receives packets of samples.

The first action comprises sub-actions S102 and S104:

S102: The first IED 200a determines a first time difference between the local reference clock 140a of the first substation 120a and the common reference clock 130.

The common reference clock 130 may for example provide a time indication over the packet-switched network. This is exactly the definition of the time offset $\Delta$. S104: The first IED 200a sends a first packet of samples, as obtained within the first substation 120a, to the second IED 200b over the network interface 180b and the packet-switched network. The first packet is provided with time information according to the local reference clock 140a of the first substation 120a. The time information may for example comprise a timestamp according to the local reference clock and an indication of the first time difference. Thus, the value of $\Delta$ might be sent in the first packet. This enables the second IED 200b to determine how much its own local reference clock 140b differs from the local reference clock 140a of the first substation 120a.

In some aspects it is thus assumed that the first IED 200a sends packets of samples to another substation, for example comprising IEDs 200b:200c.

The second action comprises sub-actions S106 and S108:

S106: The first IED 200a receives a second packet of samples, as obtained within the second substation 120b, from the second IED 200b over the network interface 180b. The second packet is provided with time information according to the local reference clock 140b of the second substation 120b. The time information may for example comprise a timestamp according to the local reference clock an indication of a second time difference as determined by the second IED 200b between the local reference clock 140b of the second substation 120b and the common reference clock 130.

In some aspects, it is thus assumed that the first IED 200a receives packets of samples from the other IEDs 200b:200c. The first IED 200a might then use the information of the determined first time difference, as determined in action S102, and the indication of a second time difference to determine how much the local reference clock 140b of the second substation 120b differs from the local reference clock 140a of the first substation 120a. Knowledge thereof is then used to adjust the timestamp of the samples received from the second IED 200b.

S108: The first IED 200a performs time-wise synchronization of the samples of the second packet with samples as obtained within the first substation 120a by time-wise compensating the samples of the second packet according to a difference between the first time difference and the second time difference.

This enables all samples to be timestamped using a common time scale, regardless of where in the substation network 100 the samples are obtained.

Thus, in some embodiments sub-actions S102 and S104 are performed whereas sub-actions S106 and S108 are not performed, in some embodiments sub-actions S102 and S104 are not performed whereas sub-actions S106 and S108 are performed, and in some embodiments sub-actions S102, S104, S106 and S108 are all performed.

Embodiments relating to further details of time-synchronized communication of packets between substations as performed at the first substation 120a will now be disclosed.

In some aspects, each IED 200a, 200b comprises its own substation interface 180a for communication within its substation 120a, 120b and a network interface 180b for communication with IEDs 200a, 200b, 200c of other substations 120a, 120b, 120c over the packet-switched network. In some aspects, each substation interface 180a is associated with its own local reference clock 140a, 140b used as substation-internal time synchronization reference. In some aspects, the network interface 180b is associated with the common reference clock 130.

In scenarios where there are three or more substations 120a:120c, there could be separate communication links between the different substations i.e., a first communication link between substation 120a and substation 120b, a second communication link between substation 120a and substation 120c, and a third communication link between substation 120b and substation 120c, etc. Then, there might be one common reference clock 130 per communication link instead of one common reference clock for all communication links. Then the first IED 200a in step S102 determines a respective first time difference between the local reference clock 140a of the first substation 120a and the respective common reference clocks 130 for all communication links used by the first IED 200a for transmission and reception of packets to/from other IEDs 200b:200c.

In general terms, the line differential protection function 150a is based on current (and voltage) measurements in each end of a line or a network. Measurements (or sampling of current (and voltage) values) might be performed in the IEDs 200a:200b, the MUs 170a:170f or via a non-conventional instrument transformer (NCIT), and other suitable measurement equipment and/or sensors. So at least two ends are needed, but it may be up to five depending on the network topology and the availability of process equipment. In the present disclosure, each end is represented by one substation 120a:120c. The basic working principle of a line differential protection function 150a is to add all together all received currents. When the line, or network, is without fault, the sum should be zero (or close to zero, depending on measurement accuracy), but in presence of a fault the sum will show the non-zero differential current that is passing through the fault. To be able to calculate this differential current, the samples (or phasors) must be aligned in time before the summation is made, otherwise there is a risk of false differential currents. A common time reference between the samples from different sources is therefore required for the line differential protection function 150a to operate correctly.

As noted above, the common reference clock 130 is used as a reference for the communication between the IEDs 200a:200c, and thus for the exchange of samples. The samples might either be raw samples that are timestamped or calculated phasors that are timestamped. Knowledge of the time given by the common reference clock 130 can be used in different ways, either to compensate the timestamp at the sending side or to provide the offset as additional information together with the original timestamp. Then this additional information can be used at the receiving end to compensate, or resample, the received samples to be time-wise synchronized to its own samples. Further, this additional information can be used at the sending end to compensate, or resample, the samples based on the common reference clock 130 to a common sample time, already before sending the samples to the receiving end.

In some examples, the samples represent current values. According to an embodiment, the first IED 200a is then configured to perform action S110:

S110: The first IED 200a calculates a differential current as a difference between the compensated samples and the samples as obtained within the first substation 120a.

This differential current might then be provided to the line differential protection function 150a. Thus, according to an embodiment, the first IED 200a is configured to perform action S114:

S114: The first IED 200a provides the differential current to a line differential protection function 150a in the first substation 120a.

However, in some aspects, the differential current is provided to the line differential protection function 150a only upon the first IED 200a having verified that the difference between the first time difference and the second time difference is smaller than a time threshold. That is, according to an embodiment, the first IED 200a is configured to perform action S112:

S112: The first IED 200a verifies that the difference between the first time difference and the second time difference is smaller than a time threshold.

Action S114 is then entered only when the verification in S112 is successful.

In some aspects, when the difference between the first time difference and the second time difference is not smaller than the time threshold, the line differential protection function 150a should be blocked. That is, according to an embodiment, the first IED 200a is configured to perform action S116:

S116: The first IED 200a blocks the line differential protection function 150a from receiving the differential current when the difference between the first time difference and the second time difference is not smaller than the time threshold.

Further, if PTP is used, then there might be a quality indication of the accuracy of the difference and this quality indication might be used to selectively block the line differential protection function 150a from receiving the differential current when the quality indication is below a quality threshold. In relation thereto, also a quality indicator of the first time difference as determined in S102 (i.e., the value of A) might therefore be transmitted to the second IED 200b, and thus a corresponding quality indicator of the second time difference as determined by the second IED 200b might be received by the first IED 200a.

Further, an alarm notification of lost time-synchronized communication might be issued when the difference between the first time difference and the second time difference is not smaller than the time threshold. That is, according to an embodiment, the first IED 200a is configured to perform action S118:

S118: The first IED 200a issues an alarm notification of lost time-synchronized communication when the difference between the first time difference and the second time difference is not smaller than the time threshold.

Figure 4:
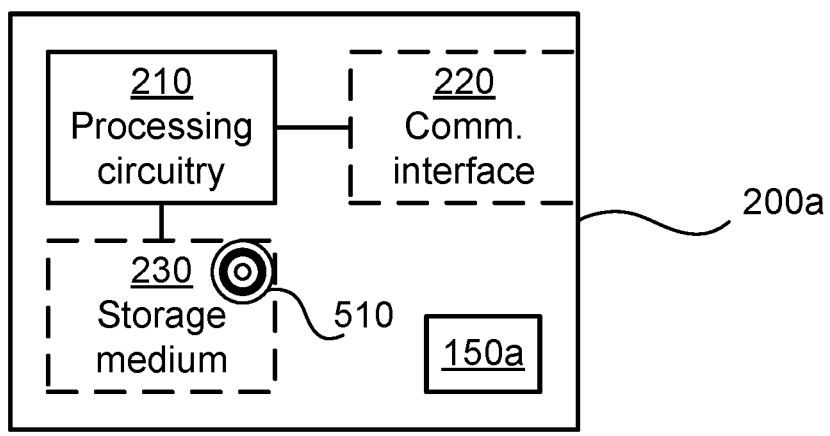
FIG. 4 is a schematic diagram showing functional units of an IED according to an embodiment.

FIG. 4 schematically illustrates, in terms of a number of functional units, the components of an IED 200a of a substation 120a according to an embodiment.

Processing circuitry 210 is provided using any combination of one or more of a suitable central processing unit (CPU), multiprocessor, microcontroller, digital signal processor (DSP), etc., capable of executing software instructions stored in a computer program product 510 (as in FIG. 5), e.g. in the form of a storage medium 230. The processing circuitry 210 may further be provided as at least one application specific integrated circuit (ASIC), or field programmable gate array (FPGA).

Particularly, the processing circuitry 210 is configured to cause the IED 200a to perform a set of operations, or actions, at the substation as disclosed above. For example, the storage medium 230 may store the set of operations, and the processing circuitry 210 may be configured to retrieve the set of operations from the storage medium 230 to cause the IED 200a to perform the set of operations. The set of operations may be provided as a set of executable instructions.

Thus, the processing circuitry 210 is thereby arranged to execute methods as herein disclosed. The storage medium 230 may also comprise persistent storage, which, for example, can be any single one or combination of magnetic memory, optical memory, solid state memory or even remotely mounted memory. The IED 200a may further comprise a communications interface 220. As such the communications interface 220 may comprise one or more transmitters and receivers, comprising analogue and digital components.

In particular, the communications interface 220 implements the substation interface 180a for communication of the IED 200a within its substation 120a and the network interface 180b for communication of the IED 200a with other IEDs 200b, 200c of other substations 120b, 120c over a communication channel, such as a packet-switched network.

The processing circuitry 210 controls the general operation of the IED 200a e.g. by sending data and control signals to the communications interface 220 and the storage medium 230, by receiving data and reports from the communications interface 220, and by retrieving data and instructions from the storage medium 230.

As disclosed above, a line differential protection function 150a is part of, integrated with, or collocated with, the IED 200a. Hence, in some aspects the IED 200a further comprises the line differential protection function 150a.

Other components, as well as the related functionality, of the IED 200a are omitted in order not to obscure the concepts presented herein.

Figure 5:
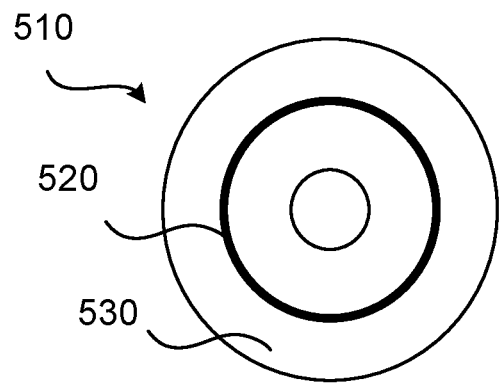
FIG. 5 shows one example of a computer program product comprising computer readable storage medium according to an embodiment.

FIG. 5 shows one example of a computer program product 510 comprising computer readable storage medium 530. On this computer readable storage medium 530, a computer program 520 can be stored, which computer program 520 can cause the processing circuitry 210 and thereto operatively coupled entities and devices, such as the communications interface 220 and the storage medium 230, to execute methods according to embodiments described herein. The computer program 520 and/or computer program product 510 may thus provide means for performing any actions as herein disclosed.

In the example of FIG. 5, the computer program product 510 is illustrated as an optical disc, such as a CD (compact disc) or a DVD (digital versatile disc) or a Blu-Ray disc. The computer program product 510 could also be embodied as a memory, such as a random access memory (RAM), a read-only memory (ROM), an erasable programmable read-only memory (EPROM), or an electrically erasable programmable read-only memory (EEPROM) and more particularly as a non-volatile storage medium of a device in an external memory such as a USB (Universal Serial Bus) memory or a Flash memory, such as a compact Flash memory. Thus, while the computer program 520 is here schematically shown as a track on the depicted optical disk, the computer program 520 can be stored in any way which is suitable for the computer program product 510.

The inventive concept has mainly been described above with reference to a few embodiments. However, as is readily appreciated by a person skilled in the art, other embodiments than the ones disclosed above are equally possible within the scope of the inventive concept, as defined by the appended patent claims.

The invention claimed is:

1. A method for time-synchronized communication of packets between a first substation and a second substation interconnected by a communication channel, wherein the method is performed at the first substation, and wherein the method comprises:
   receiving a packet of samples from the second substation over the communication channel, wherein the samples have been obtained within the second substation and provided with time information associated with a common reference clock;
   receiving a time indication from the common reference clock over the communication channel; and
   performing time-wise synchronization of the samples of the received packet with samples obtained within the first substation by time-wisely compensating the samples of the received packet by means of the time information and a first time difference between the common reference clock and a local reference clock of the first substation.

2. The method according to claim 1, wherein the time information comprises a timestamp of the samples according to the common reference clock.

3. The method according to claim 1, wherein the time information comprises a timestamp of the samples according to the local reference clock of the second substation and an indication of a second time difference between the local reference clock of the second substation and the common reference clock.

4. The method according to claim 3, wherein there is a time difference between the common reference clock and the local reference clock of the first and/or the second sub station.

5. The method according to claim 1, further comprising:
   providing the samples obtained within the first substations with time information associated with the common reference clock; and
   sending the samples in a first packet of samples to the second substation over the communication channel;
   wherein the packet of samples received from the second substation is a second packet of samples.

6. The method according to claim 1, wherein the method is performed by a first intelligent electronic device of the first substation and by a second IED of the second substation, wherein the first and second IED communicate with each other over the communication channel.

7. The method according to claim 6, wherein each IED comprises its own substation interface for communication within its substation and a network interface for communication with IEDs of other substations over the communication channel, wherein each substation interface is associated with its own local reference clock used as a substation-internal time synchronization reference, and wherein the network interface is configured to receive a signal from the common reference clock.

8. The method according to claim 1, wherein the samples represent current values, and wherein the method further comprises:
   calculating a differential current as a difference between the compensated samples and the samples as obtained within the first substation; and
   providing the differential current to a line differential protection function in the first substation.

9. The method according to claim 8, further comprising:
   determining the first time difference as the difference between the common reference clock and the local reference clock of the first substation, and a second time difference as a difference between the common reference clock and a local reference clock of the second substation; and
   verifying that a difference between the first time difference and the second time difference is smaller than a time threshold before providing the differential current to the line differential protection function.

10. The method according to claim 9, wherein the method further comprises blocking the line differential protection function, when the difference between the first time difference and the second time difference is not smaller than the time threshold.

11. The method according to claim 1, wherein each of the local reference clocks has higher accuracy than the common reference clock.

12. The method according to claim 11, wherein the common reference clock is either a network clock or one of the substation clocks.

13. An intelligent electronic device (IED) for time-synchronized communication of packets between a first and a second substation interconnected by a communication channel, the IED comprising processing circuitry, the processing circuitry being configured to cause the IED to perform a method comprising:
   receiving a packet of samples from the second substation over the communication channel, wherein the samples have been obtained within the second substation and provided with time information associated with a common reference clock;

receiving a time indication from the common reference clock over the communication channel; and performing time-wise synchronization of the samples of the received packet with samples obtained within the first substation by time-wisely compensating the samples of the received packet by means of the time information and a first time difference between the common reference clock and a local reference clock of the first substation.

14. The IED according to claim 13, wherein the time information comprises a timestamp of the samples according to the common reference clock.

15. The IED according to claim 13, wherein the time information comprises a timestamp of the samples according to the local reference clock of the second substation and an indication of a second time difference between the local reference clock of the second substation and the common reference clock.

16. The IED according to claim 13, wherein the method further comprises:

providing the samples obtained within the first substations with time information associated with the common reference clock; and sending the samples in a first packet of samples to the second substation over the communication channel;

wherein the packet of samples received from the second substation is a second packet of samples.

17. The IED according to claim 13, further comprising a substation interface for communication within the first substation, and a network interface for communication with IEDs of other substations over the communication channel, wherein the substation interface is associated with a local reference clock used as a substation-internal time synchronization reference, and wherein the network interface is configured to receive a signal from the common reference clock.

18. The IED according to claim 13, wherein the samples represent current values, and wherein the method further comprises:

calculating a differential current as a difference between the compensated samples and the samples as obtained within the first substation; and providing the differential current to a line differential protection function in the first sub station.

19. The IED according to claim 13, wherein the local reference clock has higher accuracy than the common reference clock.

20. A non-transitory computer-readable storage medium having stored thereon a computer program comprising computer code which when run on processing circuitry of an intelligent electronic device (IED) of a first substation, interconnected by a communication channel with a second substation, causes the IED to perform a method comprising:

receiving a packet of samples from the second substation over the communication channel, wherein the samples have been obtained within the second substation and provided with time information associated with a common reference clock;

receiving a time indication from the common reference clock over the communication channel; and performing time-wise synchronization of the samples of the received packet with samples obtained within the first substation by time-wisely compensating the samples of the received packet by means of the time information and a first time difference between the common reference clock and a local reference clock of the first substation.

* * * * *